(12) United States Patent
Rezzi et al.

(10) Patent No.: US 7,595,745 B1
(45) Date of Patent: *Sep. 29, 2009

(54) CIRCUIT FOR CONVERTING A VOLTAGE RANGE OF A LOGIC SIGNAL

(75) Inventors: Francesco Rezzi, Cava Manara (IT); Nicola Ghittori, Pavia (IT); Giovanni Antonio Cesura, Cremona (IT); Shafiq M. Jamal, Gilroy, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/836,619

(22) Filed: Aug. 9, 2007

Related U.S. Application Data

(60) Provisional application No. 60/821,902, filed on Aug. 9, 2006.

(51) Int. Cl.
*H03M 1/00* (2006.01)
(52) U.S. Cl. ................ 341/136; 326/86; 327/538
(58) Field of Classification Search ......... 341/130–155; 327/538–543; 326/83
See application file for complete search history.

(56) References Cited

U.S. PATENT DOCUMENTS

| 3,961,326 | A |   | 6/1976 | Craven |
|---|---|---|---|---|
| 4,825,099 | A | * | 4/1989 | Barton ............... 326/86 |
| 4,937,477 | A |   | 6/1990 | Tsoi et al. |
| 5,028,817 | A |   | 7/1991 | Patil |
| 5,128,556 | A | * | 7/1992 | Hirakata ............... 326/115 |
| 5,539,341 | A |   | 7/1996 | Kuo |
| 5,625,360 | A |   | 4/1997 | Garrity et al. |
| 5,751,186 | A |   | 5/1998 | Nakao et al. |
| 5,781,026 | A |   | 7/1998 | Chow |
| 5,900,741 | A |   | 5/1999 | Roohparvar |
| 5,909,187 | A |   | 6/1999 | Ahuja |
| 6,100,830 | A |   | 8/2000 | Dedic |
| 6,188,244 | B1 | * | 2/2001 | Joo et al. .............. 326/83 |
| 6,339,344 | B1 |   | 1/2002 | Sakata et al. |
| 6,407,688 | B1 |   | 6/2002 | Greig |
| 7,023,367 | B1 |   | 4/2006 | Manganaro |
| 7,034,733 | B2 |   | 4/2006 | Dedic et al. |
| 7,355,449 | B1 |   | 4/2008 | Tran et al. |
| 7,432,741 | B1 |   | 10/2008 | Shumarayev |

OTHER PUBLICATIONS

U.S. Appl. No. 11/836,571, filed Aug. 9, 2007, Rezzi et al.
U.S. Appl. No. 11/836,584, filed Aug. 9, 2007, Rezzi et al.
U.S. Appl. No. 11/836,628, filed Aug. 9, 2007, Rezzi et al.
U.S. Appl. No. 11/836,635, filed Aug. 9, 2007, Rezzi et al.
U.S. Appl. No. 11/846,292, filed Aug. 28, 2007, Rezzi et al.
Office Action in U.S. Appl. No. 11/836,628, dated Nov. 12, 2008.
Office Action for U.S. Appl. No. 11/836,635 dated May 21, 2009.
Notice of Allowance for U.S. Appl. No. 11/836,584.

* cited by examiner

*Primary Examiner*—Lam T Mai

(57) ABSTRACT

In a circuit to convert a first logic signal having a first range to a second logic signal having a second range, a switch selectively couples an output node to a first reference voltage when the output node is to be in a first state based on the control signal. A source-follower circuit having a current source establishes a second reference voltage. A logic circuit coupled to the switch and the source-follower circuit and having a logic gate selectively discharges, in accordance with the control signal, the output node to the second reference voltage when the output node is to transition from the first state to a second state.

34 Claims, 9 Drawing Sheets

CIRCUIT FOR CONVERTING A VOLTAGE RANGE OF A LOGIC SIGNAL

CROSS-REFERENCE TO RELATED APPLICATION

The present application claims the benefit of U.S. Provisional Application No. 60/821,902, entitled "DAC DRIVER With NMOS Source Follower+Discharging NMOS+AND Gate," filed on Aug. 9, 2006, the contents of which are hereby incorporated by reference herein in its entirety.

FIELD OF TECHNOLOGY

The present disclosure relates generally to digital circuits, and more particularly, to circuits for converting signals that vary in a first voltage range to signals that vary in a second voltage range.

DESCRIPTION OF THE RELATED ART

Typical current steering digital-to-analog converters (DACs) comprise a plurality of cells, each cell selectively supplying a current to a current summing line based on the digital value that is to be converted. The total current selectively supplied by all of the cells corresponds to the digital value, and different digital values will result in different amounts of total current.

For instance, FIG. 1 is a block diagram of an example current steering DAC 100 having a plurality of cells 104, 108, 112, and 116. Each of the cells 104, 108, 112, 116 includes an output coupled to a current summing line 120. Digital data that is to be converted may be supplied to each of the cells 104, 108, 112, 116. Each of the cells 104, 108, 112, 116 cells includes a current source and a switch that selectively, based on the digital data, applies current from the current source to the summing line 120. The total current on the summing line 120 will correspond to the digital value, and different digital values will result in different amounts of total current on the summing line 120.

FIG. 2 is a block diagram of an example cell 150 that may be utilized in the current steering DAC 100 of FIG. 1. The cell 150 includes a current source 154 and a switch comprising a p-channel metal oxide semiconductor (PMOS) transistor 158 and a PMOS transistor 162. A source of the transistor 158 is coupled to the current source 154, and a drain of the transistor 158 is coupled to the summing line 120. A source of the transistor 162 is coupled to the current source 154, and a drain of the transistor 162 is coupled to ground. The cell 150 also includes logic 166 that receives the digital data that is to be converted and generates a switch control signal based on the digital data. The switch control signal is coupled to a gate of the transistor 158 and is coupled to an input of an inverter 170. An output of the inverter 170 is coupled to a gate of the transistor 162.

In operation, the logic 166 will generate either a low signal (e.g., 0 volts) or a high signal (e.g., 1.2 volts) depending upon a value of the digital data. If a value of the digital data results in the logic 166 generating a low signal, the transistor 158 will be turned ON. Additionally, the inverter 170 will generate a high signal, and thus the transistor 162 will be turned OFF. This will result in the current source 154 being coupled to the summing line 120. Thus, the current source 154 will supply its current to the summing line 120. On the other hand, if a value of the digital data results in the logic 166 generating a high signal, the transistor 158 will be turned OFF. Additionally, the inverter 170 will generate a low signal, and thus the transistor 162 will be turned ON. This will result in the current source 154 being coupled to ground. Thus, the current source 154 will not supply any of its current to the summing line 120.

SUMMARY OF THE DISCLOSURE

In accordance with one aspect of the disclosure, a circuit to convert a first logic signal having a first range to a second logic signal having a second range comprises a switch to selectively couple an output node to a first reference voltage when the output node is to be in a first state based on the control signal. The circuit also comprises a source-follower circuit having a current source to establish a second reference voltage. The circuit further comprises a logic circuit coupled to the switch and the source-follower circuit and having a logic gate to selectively discharge, in accordance with the control signal, the output node to the second reference voltage when the output node is to transition from the first state to a second state, the second state being a logical complement of the first state.

In accordance with another aspect of the disclosure, a driving circuit for a digital-to-analog converter cell includes a pair of switches to selectively couple a pair of output nodes to the first reference voltage when one of the pair of output nodes is to be in a first state based on the control signal. The driving circuit also includes a pair of source-follower circuits, each having a respective current source to establish the second reference voltage for a corresponding output node of the pair of output nodes. Additionally, the driving circuit includes a pair of logic circuits, each having a respective logic gate to selectively discharge, in accordance with the control signal, the corresponding output node of the pair of output nodes to the second reference voltage when the corresponding output node is to transition from the first state to a second state, the second state being a logical complement of the first state.

In accordance with yet another aspect of the disclosure, a cell of a current-steering digital-to-analog converter (DAC) includes a current source. The DAC additionally includes a first p-channel metal oxide semiconductor (PMOS) transistor having a source coupled to the current source and a drain coupled to a current summing line, and a second PMOS transistor having a source coupled to the current source and a drain coupled to a reference node. The DAC also includes a driver circuit having a control input, and first and second complementary outputs to drive respective gates of the first and second PMOS transistors, respectively. The driver circuit comprises a pair of switches to selectively couple the first and second outputs to a first reference voltage when either the first output or the second output is to be in a first state based on the control input. The driver circuit also comprises a pair of source-follower circuits, each having a respective current source to establish a second reference voltage for when the first output or the second output is to be in a second state based on the control input. The driver circuit further comprises a pair of logic circuits to selectively discharge either the first output or the second output to the second reference voltage in a transition from the first state to the second state in accordance with the control input, the second state being a logical complement of the first state.

In accordance with still another aspect of the disclosure, a method for converting a voltage range of a control signal, comprises selectively coupling an output node to a first reference voltage when the output node is to be in a first state based on the control signal, and establishing a second reference voltage. The method also comprises selectively discharging, in accordance with the control signal, the output node to the second reference voltage when the output node is to transition from the first state to a second state, the second state being a logical complement of the first state.

In accordance with yet another aspect of the disclosure, a circuit to convert a voltage range of a control signal includes means for selectively coupling an output node to a first reference voltage when the output node is to be in a first state based on the control signal, and means for establishing a second reference voltage. The circuit also includes means for selectively discharging in accordance with the control signal the output node to the second reference voltage when the output node is to transition from the first state to a second state, the second state being a logical complement of the first state.

BRIEF DESCRIPTION OF THE DRAWINGS

For a more complete understanding of the disclosure, reference should be made to the following detailed description and accompanying drawing figures, in which like reference numerals identify like elements in the figures, and in which.

DETAILED DESCRIPTION

Figure 1:
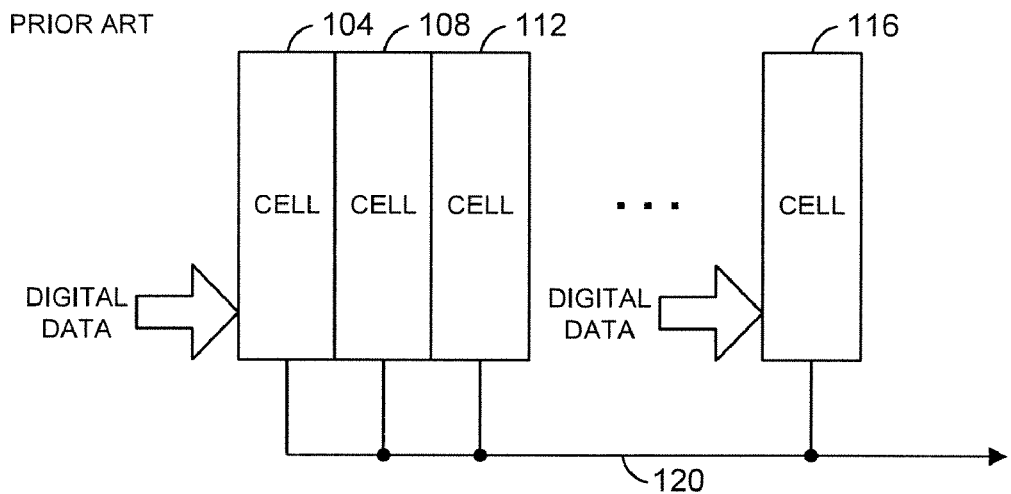
FIG. 1a block diagram of an example current steering digital-to-analog converter (DAC)
Figure 2:
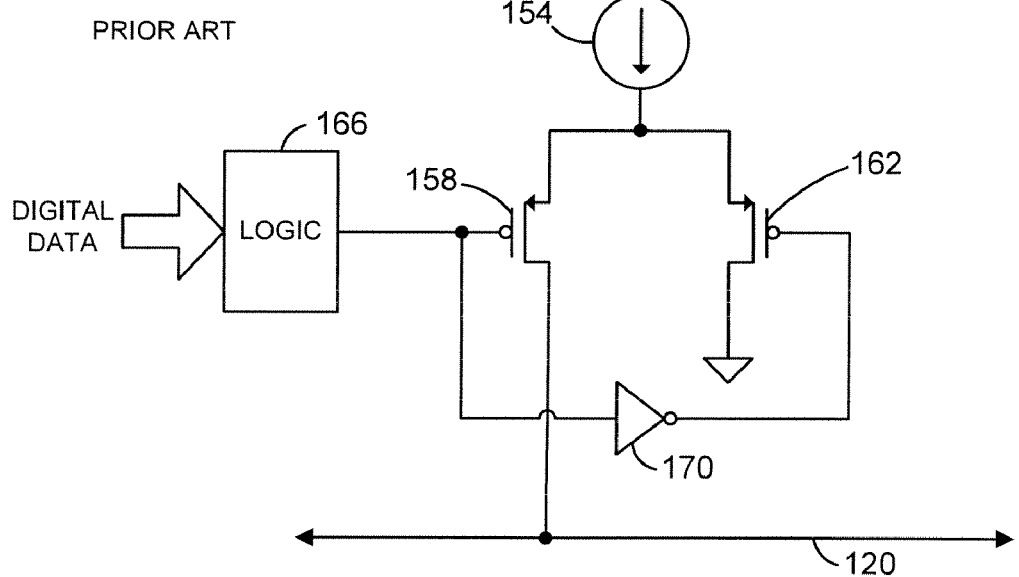
FIG. 2 is a circuit diagram of a cell of the current steering DAC of FIG. 1.
Figure 3:
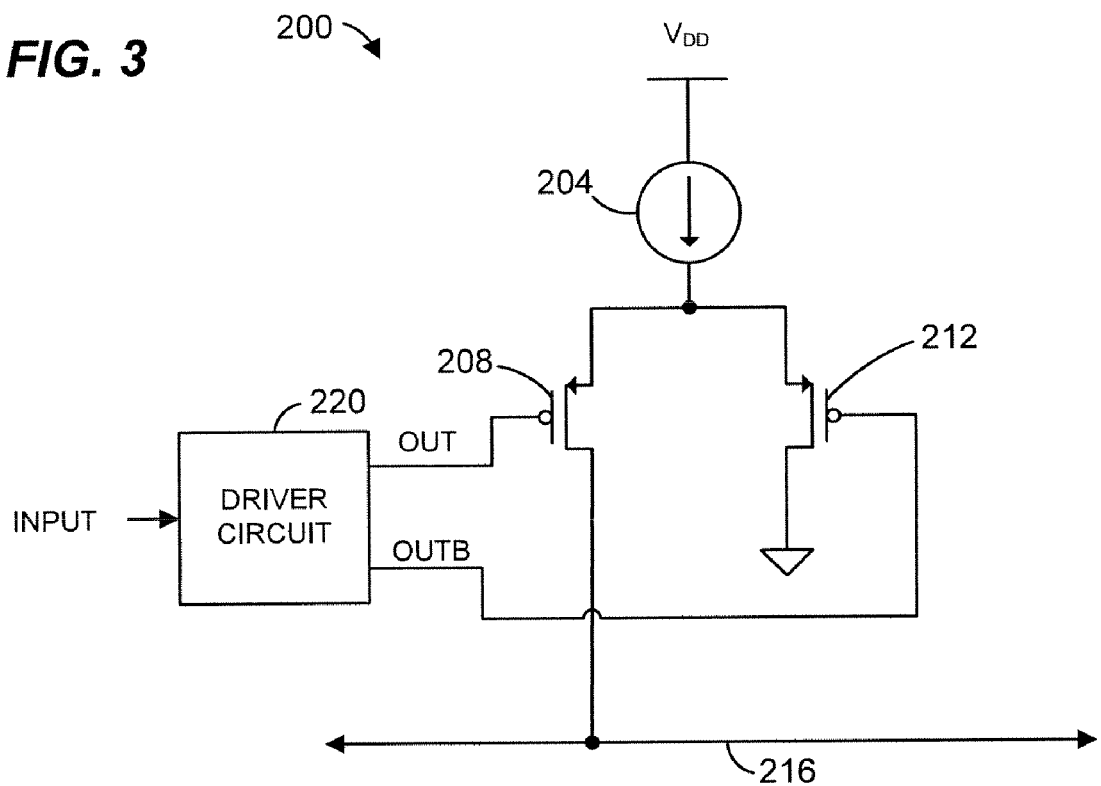
FIG. 3 is a circuit diagram of another cell that may be utilized in a current steering DAC.

FIG. 3 is a block diagram of an example cell 200 that may be utilized in a current steering DAC. The cell 200 includes a current source 204 and a switch comprising a p-channel metal oxide semiconductor (PMOS) transistor 208 and a PMOS transistor 212. A source of the transistor 208 is coupled to the current source 204, and a drain of the transistor 208 is coupled to a summing line 216. A source of the transistor 212 is coupled to the current source 204, and a drain of the transistor 212 is coupled to ground. The cell 200 also includes a driver circuit 220 that receives an input signal and generates two output signals based on the input signal. The input signal is indicative of whether the current source 204 should be coupled to or isolated from the summing line 216. The input signal may be generated by logic such as the logic block 166 of FIG. 2.

The two output signals control the transistors 208, 212 to selectively couple the current source 204 to the summing line 216. One of the output signals, OUT, is coupled to a gate of the transistor 208. The output signal, OUTB, is coupled to the gate of the transistor 212. The input signal coupled to the driving circuit 220 will vary between voltages levels for a typical CMOS device. For example, the input signal may vary between 0 volts and 1.2 volts. An input signal of approximately 0 volts may indicate that the current source 204 should be coupled to the summing line 216, and an input signal of approximately 1.2 volts may indicate that the current source 204 should be isolated from the summing line 216, for example. Alternatively, an input signal of approximately 1.2 volts may indicate that the current source 204 should be coupled to the summing line 216, and an input signal of approximately 0 volts may indicate that the current source 204 should be isolated from the summing line 216, for example.

The driving circuit 220 generates the output signals such that they vary in a range that is less than the range of that of the input signal. For example, if the input signal varies between approximately 0 volts and 1.2 volts, the output signals may vary between approximately 300 millivolts and 1.2 volts, for example, or some other desired range of reduced voltage range or swing. It has been found that, in at least some implementations, using such a reduced range reduces charge injection associated with the transistors 208, 212. It also has been found that, in at least some implementations, using such a reduced range tends to keep the transistors 208, 212 biased in a desired region, such as in saturation. In some cases, the reduced voltage range may desirably maintain a more constant output impedance for the driving circuit 220.

In operation, when the input signal is HIGH (in the standard CMOS range), the driver circuit 220 will generate the signal OUT to be HIGH (in the reduced range) and will generate the signal OUTB to be LOW (in the reduced range). Similarly, when the input signal is LOW (in the standard CMOS range), the driver circuit 220 will generate the signal OUT to be LOW (in the reduced range) and will generate the signal OUTB to be HIGH (in the reduced range). As a specific example provided merely for explanatory purposes, if the input signal is 1.2 volts, the driver circuit 220 will generate the signal OUT to be 1.2 volts and will generate the signal OUTB to be 300 millivolts. Continuing with this example, if the input signal is 0 volts, the driver circuit 220 will generate the signal OUT to be 300 millivolts and will generate the signal OUTB to be 1.2 volts.

Figure 4:
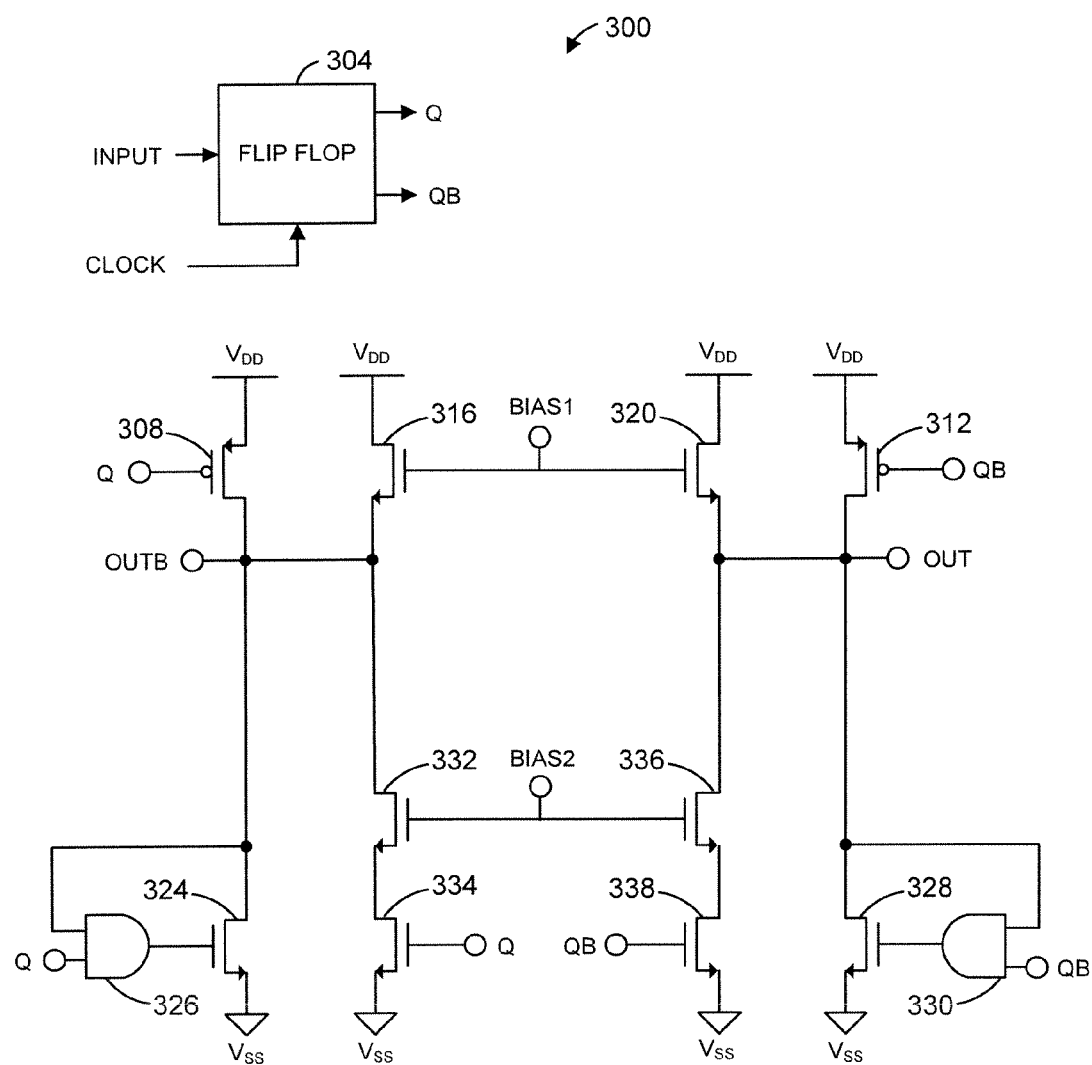
FIG. 4 is a circuit diagram of an example driver circuit that may be utilized in the cell of FIG. 3.

FIG. 4 is a circuit diagram of one example of a driving circuit 300 that may be used as the driving circuit 220 of FIG. 3. The driving circuit 300 includes a flip flop 304. The flip flop 304 includes a data input coupled to the input signal and a clock input coupled to a clock signal. The clock signal may be a clock signal of a DAC for example. The flip flop 304 generates a Q signal and a QB signal. The Q signal corresponds to the input signal, and the QB signal corresponds to the logical complement of the input signal.

The driving circuit 300 also includes a PMOS transistor 308 having a source coupled to a reference voltage $V_{DD}$, a drain coupled to a node OUTB, and a gate coupled to the Q signal. The reference voltage $V_{DD}$ may be 1.2 volts, for example, or any other suitable reference voltage. A PMOS transistor 312 has a source coupled to $V_{DD}$, a drain coupled to a node OUT, and a gate coupled to the QB signal. An n-channel metal oxide semiconductor (NMOS) transistor 316 has a drain coupled to $V_{DD}$, a source coupled to the OUTB node, and a gate coupled to a bias signal BIAS1. An NMOS transistor 320 has a drain coupled to $V_{DD}$, a source coupled to the OUT node, and a gate coupled to BIAS1.

The branch of the driving circuit 300 having the transistor 308 further includes a NMOS transistor 324 having a source coupled to the OUTB node, a drain coupled to a reference voltage $V_{SS}$, and a gate driven by an AND gate 326. As described below, the NMOS transistor 324 and the AND gate 326 form a logic circuit that improves operation by establishing a further discharge path for the OUTB node based on feedback from the OUTB node. Turning to the complementary side of the circuit 300, the branch having the transistor 312 further includes an NMOS transistor 328 having a drain coupled to the OUT node, a drain coupled to a reference voltage $V_{SS}$, and a gate driven by an AND gate 330. The reference voltage $V_{SS}$ may be ground, for example, or any other suitable reference voltage. The AND gate 326 has input ports coupled to the node OUTB and the Q signal, while the AND gate 330 has input ports coupled to the node OUT and the QB signal.

The branch of the driving circuit 300 having the transistor 316 further includes NMOS transistors 332 and 334. The NMOS transistor 332 has a drain coupled to the OUTB node, a gate coupled to a bias signal BIAS2, and a source coupled to the drain of the NMOS transistor 334. Similarly, the branch of the driving circuit 300 having the transistor 320 further includes NMOS transistors 336 and 338. The NMOS transistor 336 has a drain coupled to the OUT node, a gate coupled to the bias signal BIAS2, and a source coupled to the drain of the NMOS transistor 338. The NMOS transistors 334 and 338 have gates coupled to the Q and QB signals, respectively, and sources coupled to $V_{SS}$.

Operation of the driving circuit 300 will now be described. First, assume that the input signal is LOW, such that the Q signal is LOW, and the QB signal is HIGH. In this state, the transistor 308 is ON, and the transistor 334 is OFF. Thus, the transistor 308 acts as a switch to pull up the node OUTB to approximately $V_{DD}$. Additionally, with the Q signal LOW, the output of the AND gate 326 is LOW, such that the transistor 324 is OFF. On the complementary side of the circuit 300, the transistor switch 312 is OFF, and the transistor 338 is ON. In this event, and as will be described in more detail below, the node OUT is at some desired voltage above $V_{SS}$, and this voltage will be referred to as $V_{MIN}$. As can be seen, the transistor 308 and the transistor 312 each selectively couple a respective node OUT or OUTB to $V_{DD}$.

When the input signal transitions to HIGH, the Q signal will transition to HIGH and the QB signal will transition to LOW in response to a clock event such as a rising edge. Thus, the transistor 308 will turn OFF and the transistor 334 will turn ON. This will cause the OUTB node to discharge to $V_{SS}$ via the transistor 334, thus helping to speed the transition of the OUTB node. Furthermore, at least initially (i.e., during a short discharge period), both of the inputs to the AND gate 326 (i.e., the node OUTB and the Q signal) are HIGH, such that the output of the AND gate 326 is HIGH, and the transistor 324 is ON. In this way, the transistor 324 acts as a switch to provide another discharge path for the OUTB node. Thus, the logic gate 326 and the transistor 324 act to selectively discharge the node OUTB. Also, the transistor 334 acts to form an additional discharge path. The two discharge paths via the transistors 324 and 334 combine to support a rapid transition, discharging the parasitic capacitance associated with the OUTB node more quickly than if only the discharge path through the transistor 334 were used.

As the voltage at the OUTB node falls to a level below a threshold voltage for the AND gate 326, this information is fed back to the AND gate, such that the output of the AND gate 326 goes LOW, turning the transistor 324 OFF. The transistor 324 thus acts as a switch to close one of the discharge paths to $V_{SS}$. At this point, the OUTB node has been discharged to the level $V_{MIN}$, a voltage level above $V_{SS}$ determined by the current flow through the circuit branch having the transistors 316 and 332, as described below.

The transistor 316 and the transistor 332 act as a source-follower circuit in which the transistor 332 acts as a current source. The bias voltage BIAS2 affects how much current flows through the transistor 316 when the signal Q is HIGH, and thus affects the gate-to-source voltage ($V_{GS}$) of the transistor 316 when the signal Q is HIGH. The eventual voltage of the node OUTB will be the voltage of BIAS1 minus $V_{GS}$ of the transistor 316. The node OUTB can be made to fall to the desired voltage $V_{MIN}$ by appropriately selecting BIAS1 in light of a known value of $V_{GS}$ of the transistor 316 when the signal Q is HIGH. For example, BIAS1 could be set as $V_{MIN}+V_{GS}$. Thus, the transistor 316 and the transistor 332 act to establish $V_{MIN}$. In one specific implementation, the voltage $V_{MIN}$ may be approximately 300 millivolts. It is to be understood, however, that other values of $V_{MIN}$ may be utilized as well. For example, the voltage $V_{MIN}$ may be approximately 100 millivolts, 125 millivolts, 150 millivolts, 175 millivolts, 200 millivolts, 225 millivolts, 250 millivolts, 275 millivolts, 325 millivolts, 350 millivolts, etc. Thus, the voltages BIAS1 and BIAS2 can be selected to provide a desired value of $V_{MIN}$.

With regard to the complementary side of the driving circuit 300 responsible for the OUT node, the transition of the signal QB from HIGH TO LOW causes the transistor 312 to turn ON, and the transistor 338 to turn OFF. Also, the output of the AND gate 330 is LOW, turning the transistor 328 OFF. As a result, the node OUT will be pulled to approximately $V_{DD}$ while the node OUTB resides at $V_{MIN}$.

When the input signal transitions to LOW, the QB signal will transition to HIGH in response to a clock event such as a rising edge. Thus, the transistor 312 will turn OFF and the transistor 338 will turn ON. With the node OUT initially HIGH, the output of the AND gate 330 goes HIGH, turning the discharging transistor 328 ON. This will cause the OUT node to discharge to $V_{SS}$ via the transistor 328, thus helping to speed the transition of the OUTB node. As the voltage of the node OUT falls, the transistor 328 will eventually turn OFF once the node OUT falls below the threshold voltage of the AND gate 330.

The transistor 320 and the transistor 336 act as a source-follower circuit in a fashion similar to the one described above, and in which the transistor 336 is a current source for the source-follower circuit. Thus, the eventual voltage of the node OUT will equal the voltage of BIAS1 minus $V_{GS}$ of the transistor 320. Further to the discussion above with respect to making the node OUTB fall to the desired voltage $V_{MIN}$, the node OUT also can be made to fall to the desired voltage $V_{MIN}$ by appropriately selecting BIAS1 in light of a known value of $V_{GS}$ of the transistor 320 (e.g., BIAS1=$V_{MIN}+V_{GS}$). The bias voltage BIAS2 affects how much current flows through the transistor 320 when the signal QB is HIGH, and thus affects the gate-to-source voltage ($V_{GS}$) of the transistor 320 when QB is HIGH. In other words, the voltages BIAS1 and BIAS2 can be selected to provide a desired value of $V_{MIN}$ for this side of the driving circuit 300 as well.

Turning back to the side of the driving circuit 300 responsible for the output node OUTB, with the input signal now LOW, the signal Q is low, and the transistor 308 turns ON, acting as a switch to pull up the node OUTB toward $V_{DD}$.

With the signal Q low, both of the discharging transistors 324 and 334 are OFF, such that the node OUTB will be pulled to approximately $V_{DD}$.

One of ordinary skill in the art will recognize many variations to the example circuit 300 are possible. For example, the functionality provided via the logic circuits having the AND gates 326 and 330 may be implemented or achieved using logic (e.g., one or more logic gates and transistor switches) other than an AND gate followed by an NMOS transistor. As another example, if a complement output is not needed, one half of the circuit 300 may be omitted. In particular, the transistors 312, 320, 328, 336, and 338 could be omitted, along with the AND gate 330. As another example, the flip-flop 304 may be omitted. For instance, the input signal could be coupled to the gates of the transistors 308 and 334 and the AND gate 326. Also, the circuit could include an inverter having an input coupled to the input signal and an output coupled to the gates of the transistors 312 and 338, along with the AND gate 330. Still further, the example circuit 300 (or variations thereof) is not limited to implementation in a configuration in which the output node OUT tracks the input signal Q (e.g., high input leads to high output, and low input leads to low output), but rather may, for instance, be implemented such that the principal output is complementary to the input signal. In such cases, a complementing output, OUTB, may then track the input, as desired. One or ordinary skill in the art will recognize many other variations.

Figure 5:
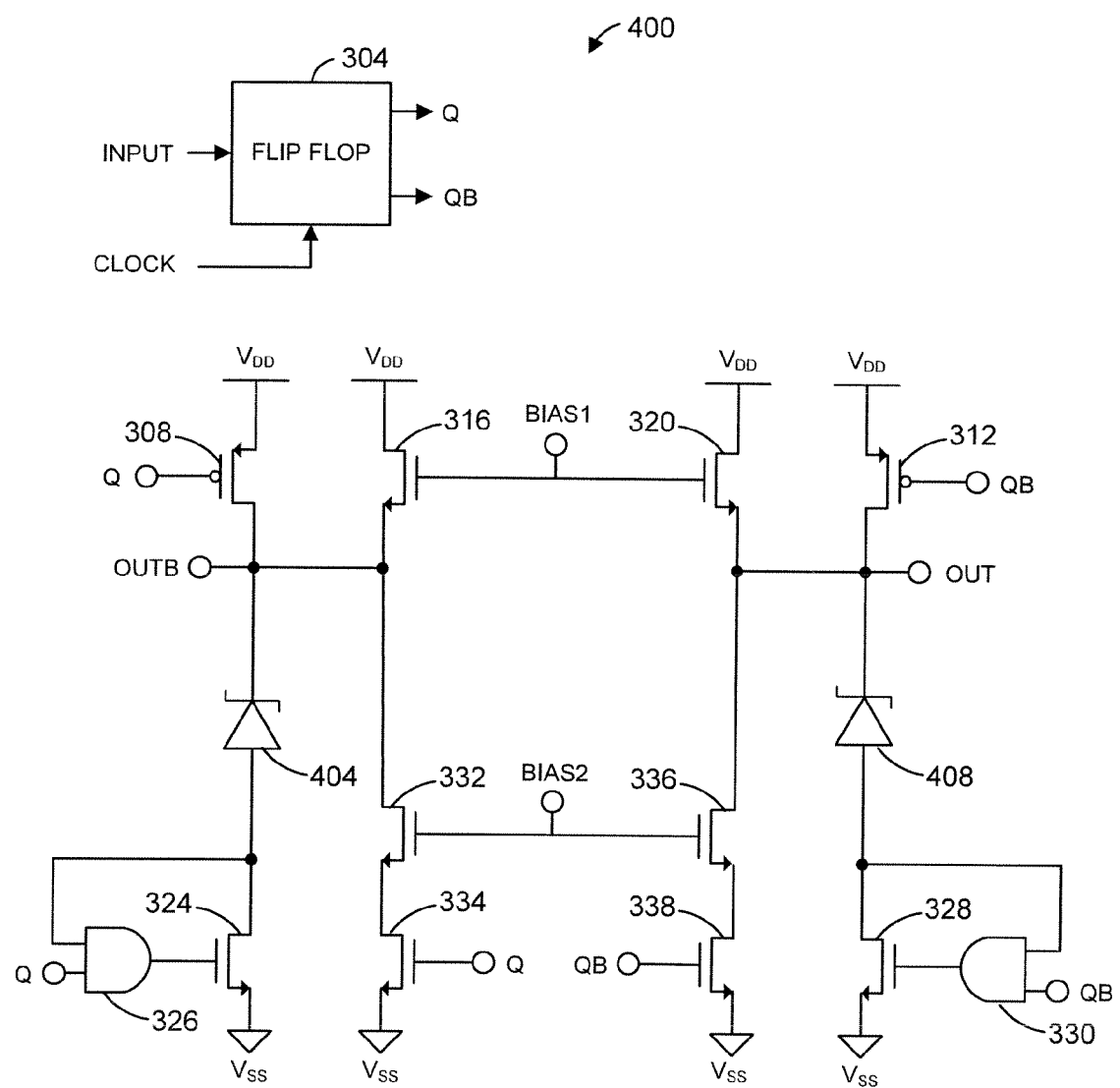
FIG. 5 is a circuit diagram of an alternative example driver circuit that may be utilized in the cell of FIG. 3.

With reference now to FIG. 5, an alternative driving circuit 400 includes a level shifter to provide, for example, design flexibility to accommodate a range of desired levels for the voltage $V_{MIN}$. The driving circuit 400 may also support the use of an AND gate having a threshold voltage lower than the voltage $V_{MIN}$, as described below. In one example, if the desired level of $V_{MIN}$ is 300 mV, and the threshold of the AND gates 326 and 330 is 250 mV, then the operation of the driving circuit 300 of FIG. 4 would result in the nodes OUT and OUTB being discharged to a level incapable of changing the output of the AND gates. As a result, the branch of the driving circuit 300 having the transistors 308 and 324 would never turn OFF.

The driving circuit 400 addresses this type of situation by inserting a level-shifting diode into the branch having the transistors 308 and 324 as shown in FIG. 5. In the example shown in FIG. 5, the level-shifting diode is a zener diode 404 disposed in reverse-biased position to establish a voltage drop between the OUTB node and the input to the AND gate 326. To address the example provided above, the zener diode 404 may, for instance, have a breakdown voltage greater than 50 mV to reduce the voltage sensed by the AND gate 326 to below 250 mV. Similarly, a zener diode 408 may be inserted in the branch of the complementary side of the driving circuit 400 having the transistors 312 and 328. Other diodes and level-shifters may be used in place of the zener diodes 404 and 408.

The use of a level shifter also supports establishing a higher $V_{MIN}$ for the OUT and OUTB nodes. For example, if the desired voltage level for $V_{MIN}$ is 500 mV, the level shifters may be utilized to accommodate AND gates having a much lower threshold, such as 300 mV. The level shifter may then reduce the voltage sensed by the AND gates by an amount appropriate to pass the threshold (e.g., 300 mV). In the example case, the voltage swing for the OUT and OUTB nodes is then approximately 500 mV to 1.2 V, while the voltage swing experienced by the AND gates is approximately 200 mV to 900 mV. In this embodiment, the logic gate 326, the transistor 324 and the diode 404 act to selectively discharge the node OUTB.

Figure 6:
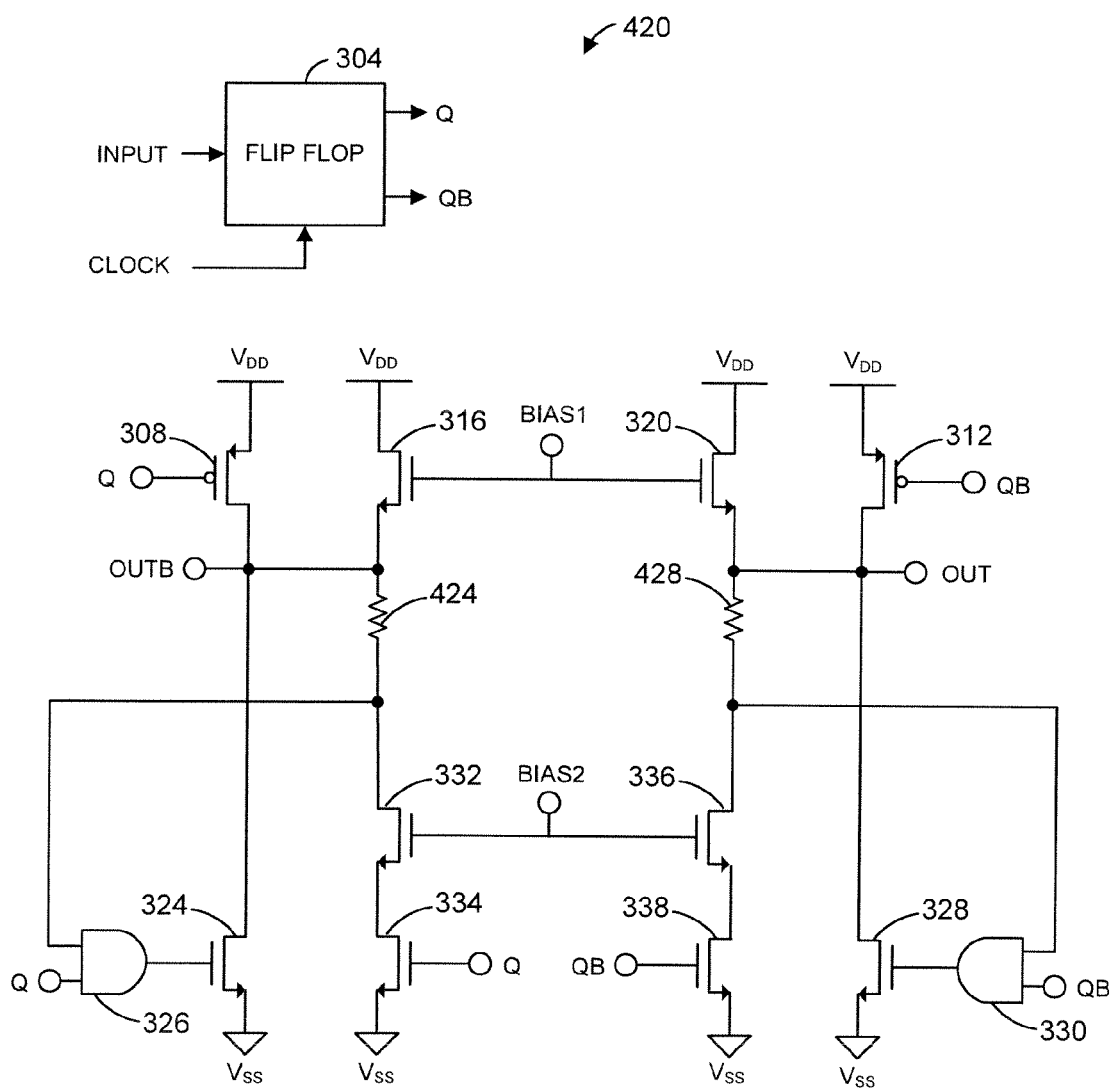
FIG. 6 is a circuit diagram of another alternative example driver circuit that may be utilized in the cell of FIG. 3.

Turning to FIG. 6, an alternative driving circuit 420 provides yet another mechanism to accommodate differences between the voltage level $V_{MIN}$ and the threshold voltage of the AND gates. In this case, the voltage level shifting element is resistive. Specifically, the driving circuit 420 includes level-shifting resistors 424 and 428 inserted in the current-follower branches of the driving circuit 420 as shown in FIG. 6. The driving circuit 420 is otherwise similar to the driving circuits described above, with the exception that the inputs to the AND gates 326 and 330 are coupled to a respective node in the current-follower branch between the resistors 424, 428 and the current source transistors 332, 336 (rather than being coupled to the OUT and OUTB nodes). In this way, the voltage drop across the resistors 424 and 428 is incorporated into the voltage sensed by the AND gates 326 and 330. In this embodiment, the logic gate 326, the transistor 324 and the resistor 424 act to selectively discharge the node OUTB.

In operation, the driving circuits 400 (FIG. 5) and 420 (FIG. 6) discharge the OUT and OUTB nodes just as described above in connection with the driving circuit 300 (FIG. 4), but with a differential between the voltage level $V_{MIN}$ and the voltage sensed by the AND gates 326 and 330.

A circuit such as described above may be utilized in a variety of devices that require the conversion of a logic signal into a signal having a reduced range. As just one example, such a circuit may be utilized in current steering DACs. More generally, such a circuit may be utilized in a variety of electronic devices such as communication devices, computation devices, storage devices, networking devices, measurement devices, etc. Referring now to FIGS. 7A-7H, a few specific examples of devices that may utilize a circuit such as such as the circuit 300, 400 or 420 will be described.

Figure 7A:
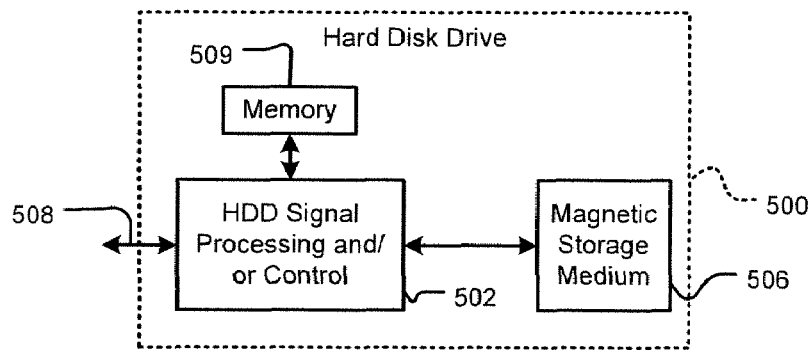
FIG. 7A is a block diagram of a hard disk drive system that may utilize a circuit such as one of the circuits of FIGS. 4-6.

For example, referring to FIG. 7A, a hard disk drive 500 may include a circuit such as the circuit 300, 400 or 420. For example, signal processing and/or control circuits, which are generally identified in FIG. 7A at 502, may include a circuit such as the circuit 300, 400 or 420. For instance, signal processing and/or control circuits 502 may include one or more current steering DACs. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a nonvolatile memory such as flash memory, read only memory (ROM) and/or other suitable electronic data storage.

Figure 7B:
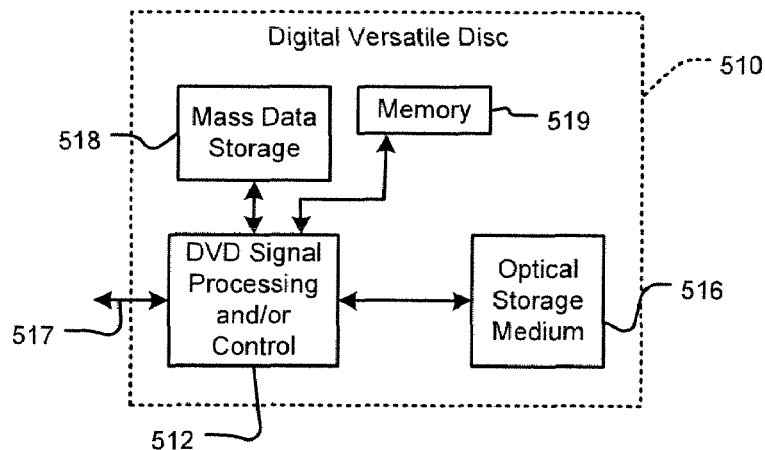
FIG. 7B is a block diagram of a digital versatile drive system that may utilize a circuit such as one of the circuits of FIGS. 4-6.

Referring now to FIG. 7B, a circuit such as the circuit 300, 400 or 420 may be utilized in a digital versatile disc (DVD) drive 510. A circuit such as the circuit 300, 400 or 420 may be utilized in either or both signal processing and/or control circuits, which are generally identified in FIG. 7B at 512, and/or mass data storage 518 of DVD drive 510. For instance, signal processing and/or control circuits 512 and/or the mass storage device 518 may include one or more current steering DACs. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 7B. The HDD may be a mini HDD that includes one or more platters having a diameter that is smaller than approximately 1.8"DVD 510 may be connected to memory 519, such as RAM, ROM, nonvolatile memory such as flash memory, and/or other suitable electronic data storage.

Figure 7C:
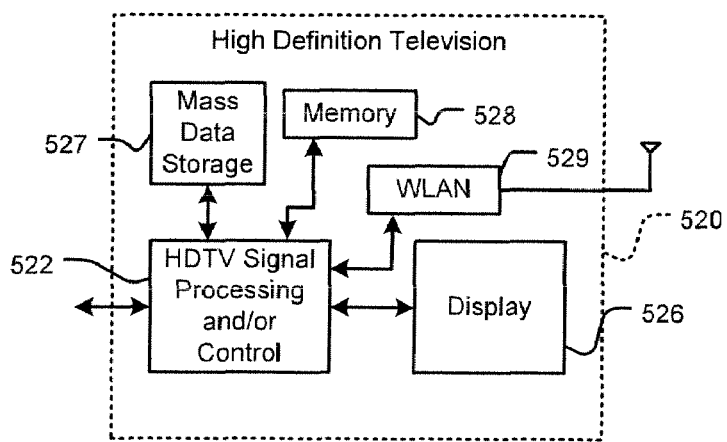
FIG. 7C is a block diagram of a high definition television that may utilize a circuit such as one of the circuits of FIGS. 4-6.

Referring to FIG. 7C, a circuit such as the circuit 300, 400 or 420 may be utilized in a high definition television (HDTV) 520. The HDTV 520 includes signal processing and/or control circuits, which are generally identified in FIG. 7C at 522, a WLAN interface 529, and a mass data storage 527. A circuit such as the circuit 300, 400 or 420 may be utilized in the WLAN interface 529 or the signal processing circuit and/or control circuit 522, for example. For instance, the WLAN interface 529 and/or signal processing and/or control circuits 522 may include one or more current steering DACs. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. The mass data storage 527 may include one or more hard disk drives (HDDs) and/or one or more digital versatile disks (DVDs). At least one HDD may have the configuration shown in FIG. 7A and/or at least one DVD may have the configuration shown in FIG. 7B. One or more of the HDDs may be a mini HDD that includes one or more platters having a diameter that is smaller than approximately 1.8"HDTV 520 may be connected to memory 528 such as RAM, ROM, nonvolatile memory such as flash memory and/or other suitable electronic data storage. HDTV 520 also may support connections with a WLAN via a WLAN network interface 529.

Figure 7D:
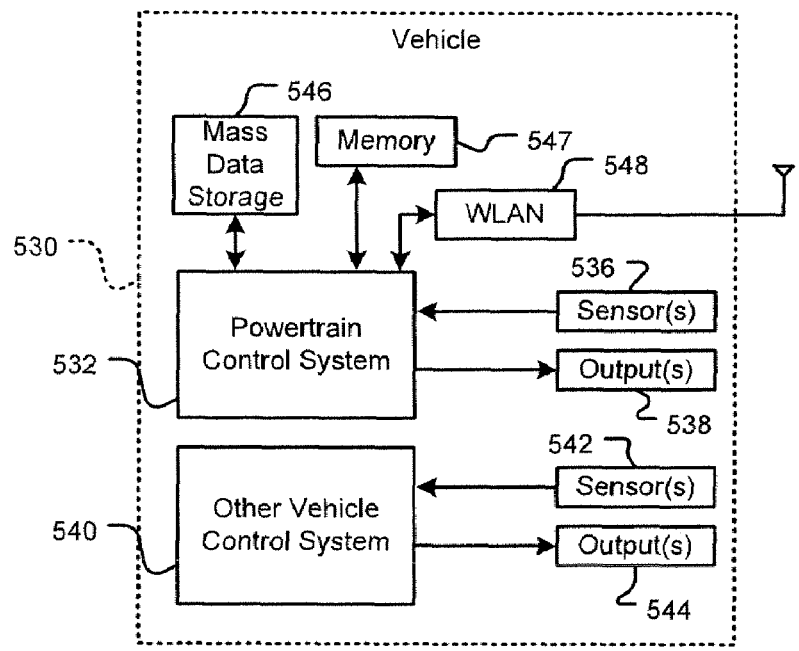
FIG. 7D is a block diagram of a vehicle that may utilize a circuit such as one of the circuits of FIGS. 4-6.

Referring now to FIG. 7D, a circuit such as the circuit 300, 400 or 420 may be utilized in a control system of a vehicle 530. In some implementations, a circuit such as the circuit 300, 400 or 420 may be utilized by a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals. For instance, the powertrain control system 532 may include one or more current steering DACs.

A circuit such as the circuit 300, 400 or 420 may be utilized in other control systems 540 of vehicle 530. For instance, control systems 540 may include one or more current steering DACs. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 7A and/or at least one DVD may have the configuration shown in FIG. 7B. One or more of the HDDs may be a mini HDD that includes one or more platters having a diameter that is smaller than approximately 1.8". Powertrain control system 532 may be connected to memory 547 such as RAM, ROM, nonvolatile memory such as flash memory and/or other suitable electronic data storage. Powertrain control system 532 also may support connections with a WLAN via a WLAN network interface 548. The WLAN interface 548 may include a circuit such as the circuit 300, 400 or 420. For instance, the WLAN interface 548 may include one or more current steering DACs. The control system 540 may also include mass data storage, memory and/or a WLAN interface (all not shown).

Figure 7E:
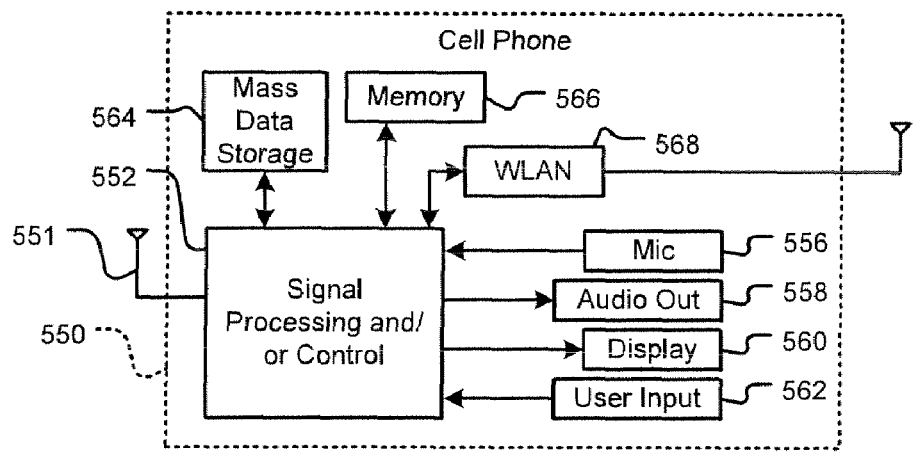
FIG. 7E is a block diagram of a cellular phone that may utilize a circuit such as one of the circuits of FIGS. 4-6.

Referring now to FIG. 7E, a circuit such as the circuit 300, 400 or 420 may be utilized in a cellular phone 550 that may include a cellular antenna 551. The cellular phone 550 includes signal processing and/or control circuits, which are generally identified in FIG. 7E at 552, a WLAN interface 568, and a mass data storage 564. A circuit such as the circuit 300, 400 or 420 may be utilized in the signal processing and/or control circuits 552 and/or the WLAN interface 568, for example. For instance, the signal processing and/or control circuits and/or the WLAN interface 568 may include one or more current steering DACs. In some implementations, cellular phone 550 includes a microphone 556, an audio output 558 such as a speaker and/or audio output jack, a display 560 and/or user input 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. At least one HDD may be a mini HDD that includes one or more platters having a diameter that is smaller than approximately 1.8". Cellular phone 550 may be connected to memory 566 such as RAM, ROM, nonvolatile memory such as flash memory and/or other suitable electronic data storage. Cellular phone 550 also may support connections with a WLAN via a WLAN network interface 568.

Figure 7F:
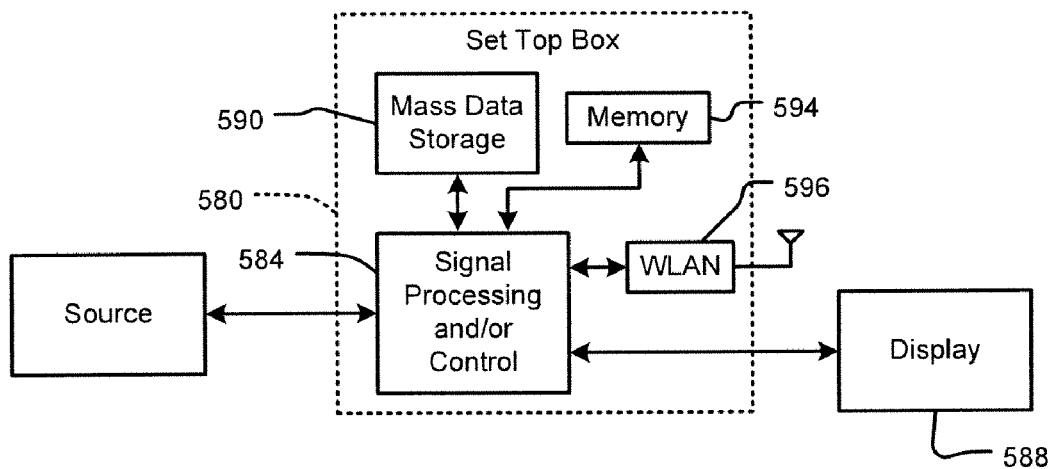
FIG. 7F is a block diagram of a set top box that may utilize a circuit such as one of the circuits of FIGS. 4-6.

Referring now to FIG. 7F, a circuit such as the circuit 300, 400 or 420 may be utilized in a set top box 580. The set top box 580 includes signal processing and/or control circuits, which are generally identified in FIG. 7F at 584, a WLAN interface 596, and a mass data storage device 590. A circuit such as the circuit 300, 400 or 420 may be utilized in the signal processing and/or control circuits 584 and/or the WLAN interface 596, for example. For instance, the signal processing and/or control circuits 584 and/or the WLAN interface 596 may include one or more current steering DACS. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 7A and/or at least one DVD may have the configuration shown in FIG. 7B. At least one HDD may be a mini HDD that includes one or more platters having a diameter that is smaller than approximately 1.8". Set top box 580 may be connected to memory 594 such as RAM, ROM, nonvolatile memory such as flash memory and/or other suitable electronic data storage. Set top box 580 also may support connections with a WLAN via a WLAN network interface 596.

Figure 7G:
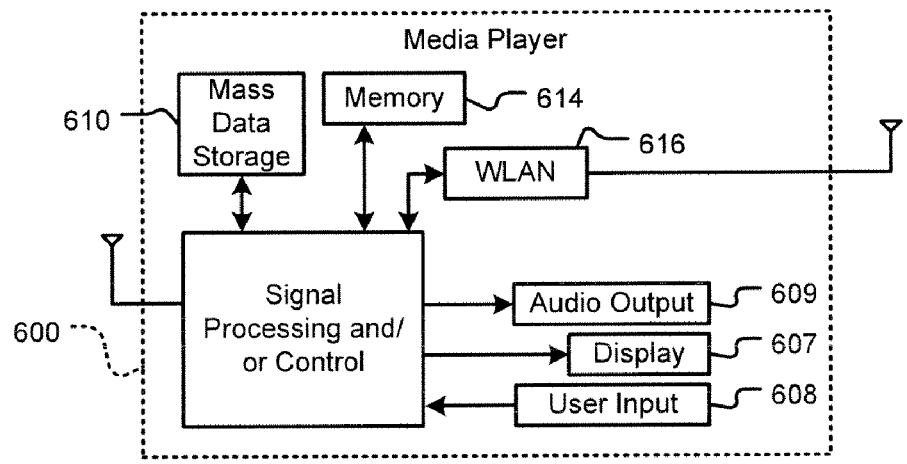
FIG. 7G is a block diagram of a media player that may utilize a circuit such as one of the circuits of FIGS. 4-6.

Referring now to FIG. 7G, a circuit such as the circuit 300, 400 or 420 may be utilized in a media player 600. The media player 600 may include signal processing and/or control circuits, which are generally identified in FIG. 7G at 604, a WLAN interface 616, and a mass data storage device 610. A circuit such as the circuit 300, 400 or 420 may be utilized in the signal processing and/or control circuits 604 and/or the WLAN interface 616, for example. For instance, the signal processing and/or control circuits 604 and/or the WLAN interface 616 may include one or more current steering DACs. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. At least one HDD may be a mini HDD that includes one or more platters having a diameter that is smaller than approximately 1.8". Media player 600 may be connected to memory 614 such as RAM, ROM, nonvolatile memory such as flash memory and/or other suitable electronic data storage. Media player 600 also may support connections with a WLAN via a WLAN network interface 616. Still other implementations in addition to those described above are contemplated.

Figure 7H:
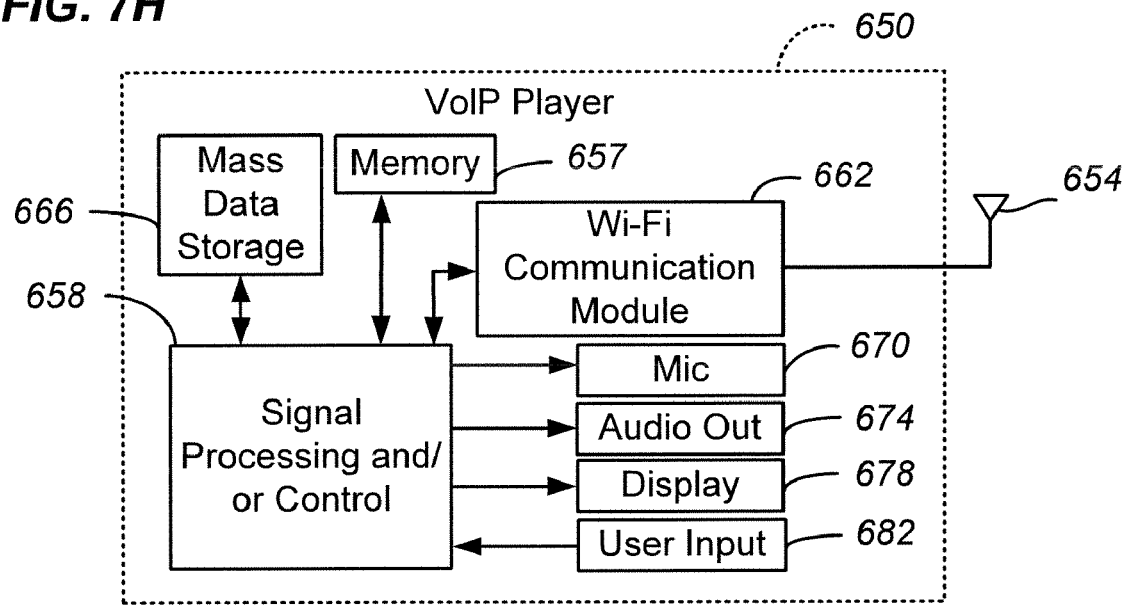
FIG. 7H is a block diagram of a voice over IP device that may utilize a circuit such as one of the circuits of FIGS. 4-6.

Referring to FIG. 7H, a circuit such as the circuit 300, 400 or 420 may be utilized in a Voice over Internet Protocol (VoIP) phone 650 that may include an antenna 654, signal processing and/or control circuits 658, a wireless interface 662, and a mass data storage 666. A circuit such as the circuit 300, 400 or 420 may be utilized in the signal processing and/or control circuits 658 and/or the wireless interface 662, for example. For instance, the signal processing and/or control circuits 658 and/or the wireless interface 662 may include one or more current steering DACs. In some implementations, VoIP phone 650 includes, in part, a microphone 670, an audio output 674 such as a speaker and/or audio output jack, a display monitor 678, a user input 682 such as a keypad, pointing device, voice actuation and/or other input devices, and a Wireless Fidelity (Wi-Fi) communication module 662. Signal processing and/or control circuits 658 and/or other circuits (not shown) in VoIP phone 650 may process data, perform coding and/or encryption, perform calculations, format data and/or perform other VoIP phone functions.

VoIP phone 650 may communicate with mass data storage 666 that stores data in a nonvolatile manner such as optical and/or magnetic storage devices, for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". VoIP phone 650 may be connected to memory 686, which may be a RAM, ROM, nonvolatile memory such as flash memory and/or other suitable electronic data storage. VoIP phone 650 is configured to establish communications link with a VoIP network (not shown) via Wi-Fi communication module 662.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A circuit to convert a voltage range of a control signal, the circuit comprising:
   a switch to selectively couple an output node to a first reference voltage when the output node is to be in a first state based on the control signal;
   a source-follower circuit having a current source to establish a second reference voltage; and
   a logic circuit coupled to the switch and the source-follower circuit and having a logic gate to selectively discharge in accordance with the control signal the output node to the second reference voltage when the output node is to transition from the first state to a second state, the second state being a logical complement of the first state.

2. A circuit according to claim 1, wherein the logic circuit comprises a metal oxide semiconductor (MOS) transistor driven by the logic gate to form a discharge path for the output node when the output node is to transition from the first state to the second state in accordance with the control signal.

3. A circuit according to claim 2, further comprising a second switch to selectively couple the output node to a second discharge path when the output node is to transition from the first state to the second state in accordance with the control signal.

4. A circuit according to claim 2, wherein the logic circuit comprises an AND gate responsive to feedback from the output node and the control signal to drive a gate of the MOS transistor.

5. A circuit according to claim 4, wherein the AND gate is configured such that a threshold voltage of the AND gate is passed when the output node reaches the second reference voltage, thereby driving the MOS transistor to disconnect the discharge path.

6. A circuit according to claim 4, further comprising a level shifter coupling the output node to the AND gate, wherein the level shifter is configured to allow the threshold voltage of the AND gate to differ from the second reference voltage.

7. A circuit according to claim 6, wherein the level shifter comprises a diode.

8. A circuit according to claim 6, wherein the level shifter comprises a resistive element.

9. A circuit according to claim 1, wherein the first and second states are established via the circuit such that the output node reflects a logical complement of the control signal.

10. A driving circuit to generate complementary output signals for a digital-to-analog converter cell in accordance with a control signal, each output signal having a voltage range between a first reference voltage and a second reference voltage, the driving circuit comprising:
   a pair of switches to selectively couple a pair of output nodes to the first reference voltage when one of the pair of output nodes is to be in a first state based on the control signal;
   a pair of source-follower circuits, each having a respective current source to establish the second reference voltage for a corresponding output node of the pair of output nodes; and
   a pair of logic circuits, each having a respective logic gate to selectively discharge in accordance with the control signal the corresponding output node of the pair of output nodes to the second reference voltage when the corresponding output node is to transition from the first state to a second state, the second state being a logical complement of the first state.

11. A driving circuit according to claim 10, wherein each logic circuit comprises a metal oxide semiconductor (MOS) transistor driven by the respective logic gate to form a discharge path when the corresponding output node is to transition from the first state to the second state in accordance with the control signal.

12. A driving circuit according to claim 11, further comprising a second pair of switches, each selectively coupling a respective output node of the pair of output nodes to a second discharge path when the corresponding output node is to transition from the first state to the second state in accordance with the control signal.

13. A driving circuit according to claim 11, wherein each logic circuit comprises a respective AND gate responsive to a voltage on the corresponding output node and the control signal to drive a gate of the MOS transistor.

14. A driving circuit according to claim 13, wherein each respective AND gate is configured such that a threshold voltage of the AND gate is passed when the corresponding output node reaches the second reference voltage, thereby driving the MOS transistor to disconnect the discharge path.

15. A driving circuit according to claim 13, further comprising a pair of level shifters, each coupling one of the respective output nodes to one of the respective AND gates, wherein each level shifter is configured to allow the threshold voltage of the corresponding AND gate to differ from the second reference voltage.

16. A driving circuit according to claim 15, wherein the level shifter comprises a diode.

17. A driving circuit according to claim 15, wherein the level shifter comprises a resistive element.

18. A driving circuit according to claim 10, wherein:
   a first switch of the pair of switches is driven by a logical complement of the control signal;
   a second switch of the pair of switches is driven by the control signal;
   the output signal established via the first switch reflects the logical state of the control signal; and
   the output signal established via the second switch reflects a complementary logical state of the control signal.

19. A cell of a current-steering digital-to-analog converter, comprising:
   a current source;
   a first p-channel metal oxide semiconductor (PMOS) transistor having a source coupled to the current source and a drain coupled to a current summing line;
   a second PMOS transistor having a source coupled to the current source and a drain coupled to a reference node; and
   a driver circuit having a control input, and first and second complementary outputs to drive respective gates of the first and second PMOS transistors, respectively, the driver circuit comprising:
      a pair of switches to selectively couple the first and second outputs to a first reference voltage when either the first output or the second output is to be in a first state based on the control input;
      a pair of source-follower circuits, each having a respective current source to establish a second reference voltage for when the first output or the second output is to be in a second state based on the control input; and
      a pair of logic circuits to selectively discharge either the first output or the second output to the second reference voltage in a transition from the first state to the second state in accordance with the control input, the second state being a logical complement of the first state.

20. A method for converting a voltage range of a control signal, the method comprising:
   selectively coupling an output node to a first reference voltage when the output node is to be in a first state based on the control signal;
   establishing a second reference voltage; and
   selectively discharging in accordance with the control signal the output node to the second reference voltage when the output node is to transition from the first state to a second state, the second state being a logical complement of the first state.

21. A method according to claim 20, wherein selectively discharging comprises forming a discharge path for the output node when the output node is to transition from the first state to the second state in accordance with the control signal.

22. A method according to claim 21, further comprising selectively coupling the output node to a second discharge path when the output node is to transition from the first state to the second state in accordance with the control signal.

23. A method according to claim 21, wherein selectively discharging is based on feedback from the output node and the control signal.

24. A method according to claim 23, wherein selectively discharging further comprises disconnecting the discharge path when the output node reaches the second reference voltage.

25. A method according to claim 23, wherein selectively discharging further comprises disconnecting the discharge path when the output node reaches a level set with reference to the second reference voltage.

26. A method according to claim 20, wherein the first and second states are established such that the output node reflects a logical complement of the control signal.

27. A circuit to convert a voltage range of a control signal, the circuit comprising:
- means for selectively coupling an output node to a first reference voltage when the output node is to be in a first state based on the control signal;
- means for establishing a second reference voltage; and
- means for selectively discharging in accordance with the control signal the output node to the second reference voltage when the output node is to transition from the first state to a second state, the second state being a logical complement of the first state.

28. A circuit according to claim 27, wherein the means for selectively discharging comprises means for forming a discharge path for the output node.

29. A circuit according to claim 28, further comprising means for forming a second discharge path for the output node.

30. A circuit according to claim 28, wherein the means for selectively discharging includes:

- an AND gate responsive to feedback from the output node and the control signal; and
- a metal oxide semiconductor (MOS) transistor driven by an output of the AND gate to form the discharge path for the output node.

31. A circuit according to claim 30, wherein the AND gate includes an input connected to the output node.

32. A circuit according to claim 30, wherein the means for selectively discharging includes a diode coupled between an input of the AND gate and the output node.

33. A circuit according to claim 30, wherein the means for selectively discharging includes a resistor coupled between an input of the AND gate and the output node.

34. A circuit according to claim 27, wherein the first and second states are established such that the output node reflects a logical complement of the control signal.

* * * * *